United States Patent
Nagase

[11] Patent Number: 6,136,723
[45] Date of Patent: Oct. 24, 2000

[54] DRY ETCHING PROCESS AND A FABRICATION PROCESS OF A SEMICONDUCTOR DEVICE USING SUCH A DRY ETCHING PROCESS

[75] Inventor: Kunihiko Nagase, Kawasaki, Japan

[73] Assignee: Fujitsu Limited, Kawasaki, Japan

[21] Appl. No.: 09/318,613

[22] Filed: May 26, 1999

[30] Foreign Application Priority Data

Sep. 9, 1998 [JP] Japan .................................. 10-255622

[51] Int. Cl.⁷ .................................................. H01L 21/00
[52] U.S. Cl. ......................... 438/725; 438/723; 438/724; 438/744
[58] Field of Search ............................ 438/10, 723, 724, 438/725, 743, 744; 216/67, 79; 252/79.1

[56] References Cited

U.S. PATENT DOCUMENTS 5,807,790  9/1998  Gupta et al. ............................ 438/725
5,920,796  7/1999  Wang et al. ........................ 438/725 X

FOREIGN PATENT DOCUMENTS 1-288853  11/1989  Japan .
1-304730  12/1989  Japan .
7-94467   4/1995   Japan .

*Primary Examiner*—William Powell
*Attorney, Agent, or Firm*—Armstrong, Westerman, Hattori, McLeland & Naughton

[57] ABSTRACT

A method of fabricating a semiconductor device includes the steps of forming a resist pattern on a conductor layer, exposing the resist pattern to any of a plasma of a rare gas, a plasma of a mixture of a rare gas and a fluorine-containing gas, and a plasma of $N_2$, and applying a dry etching process to the conductor layer while using the resist pattern as a mask.

6 Claims, 17 Drawing Sheets

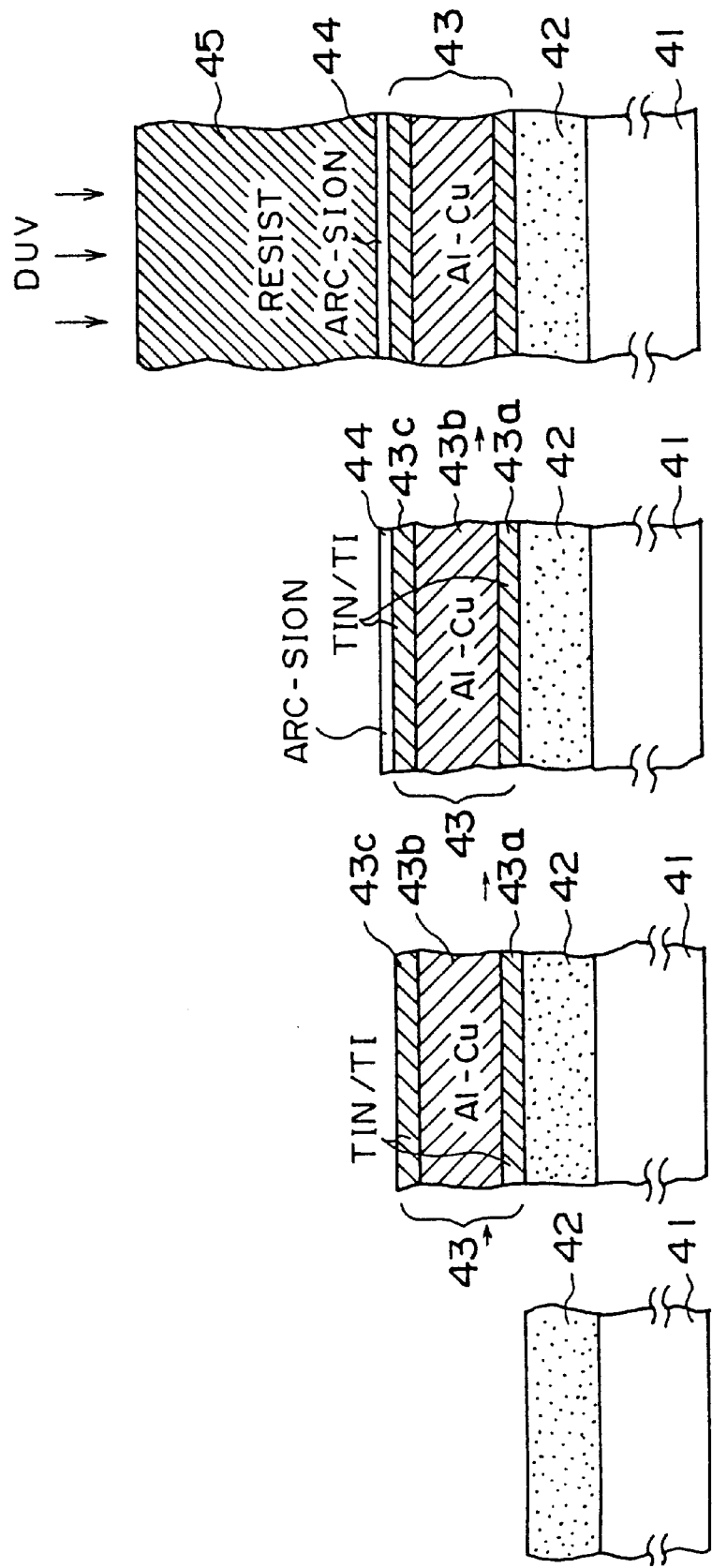

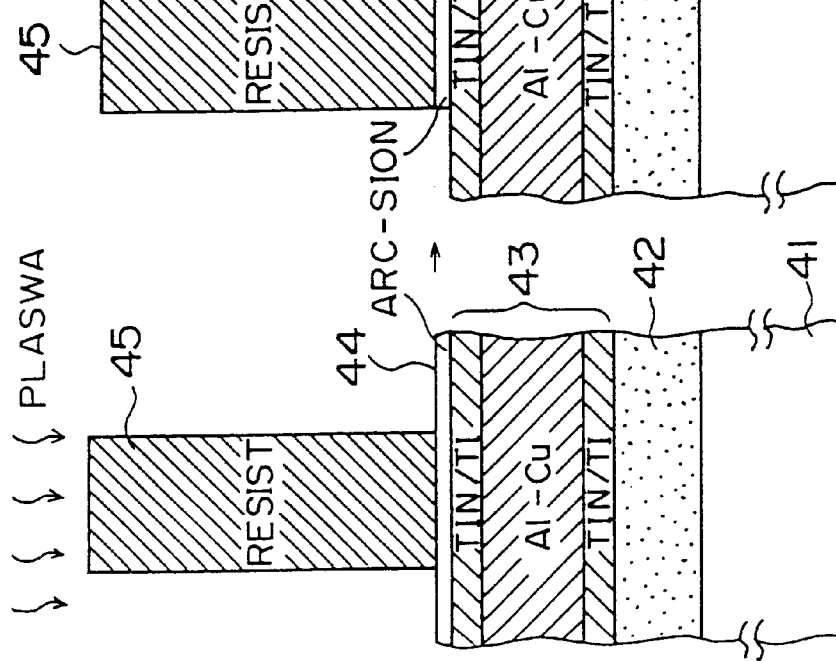

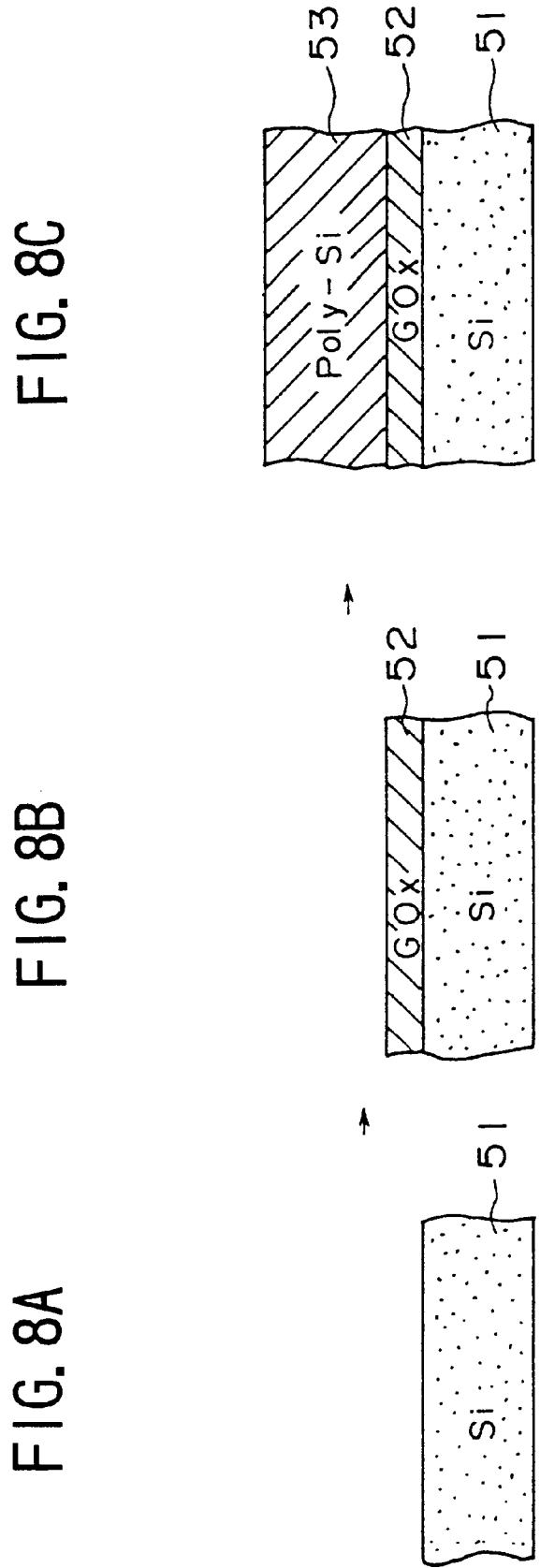

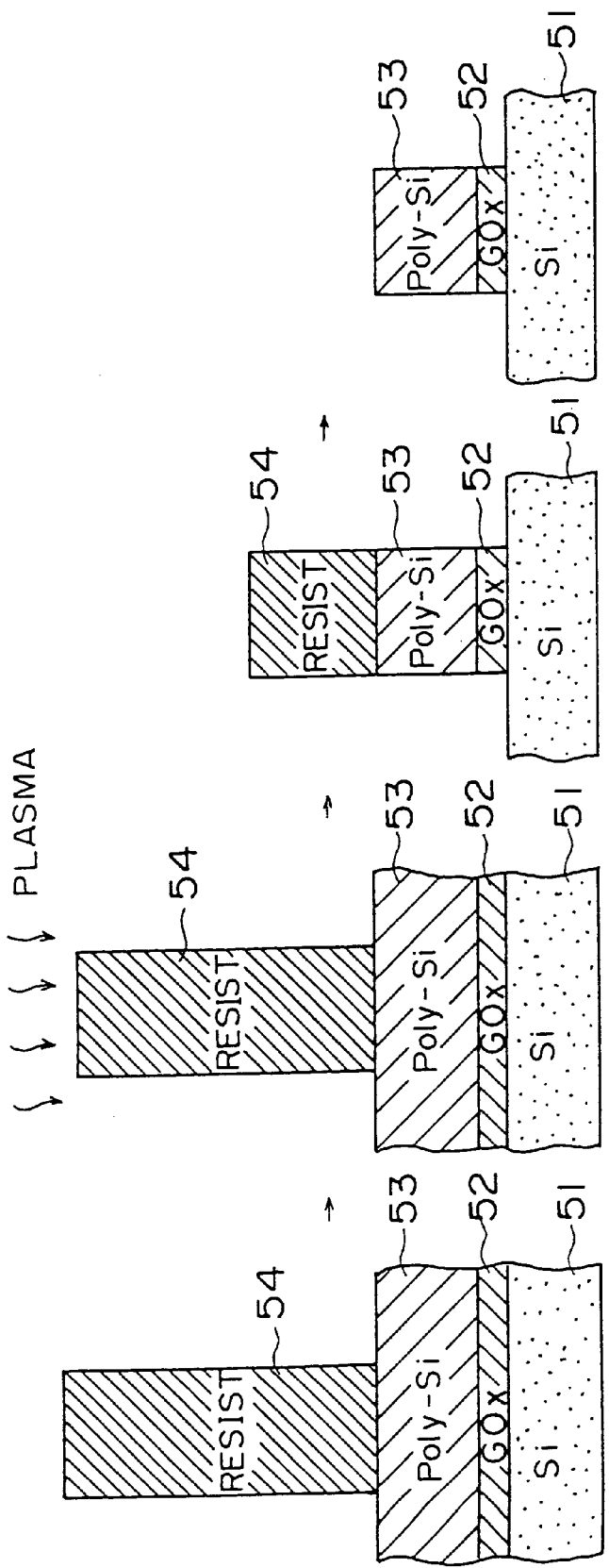

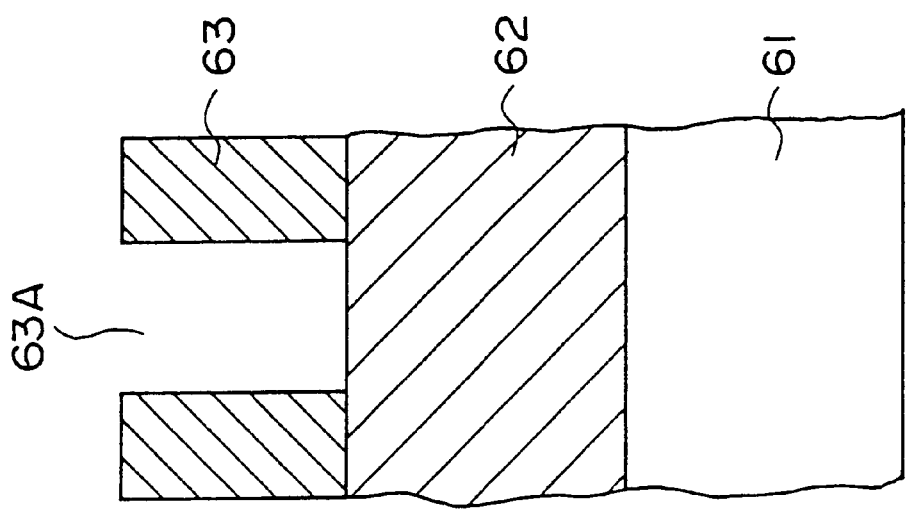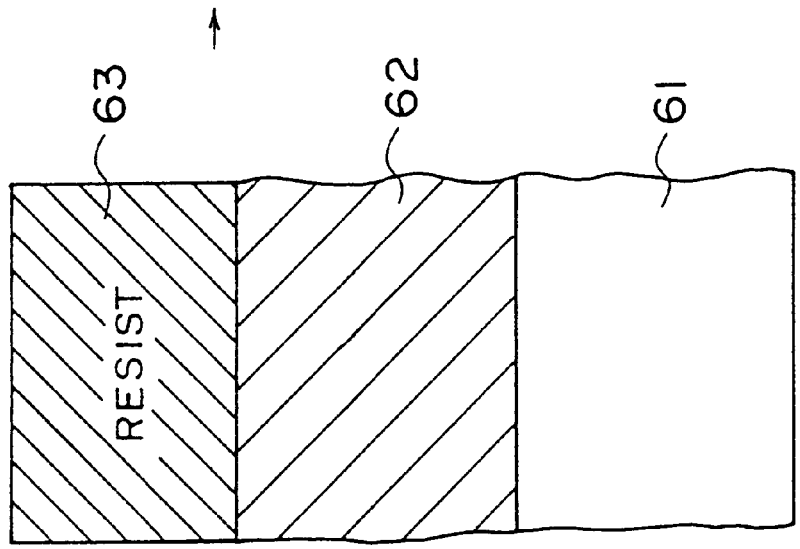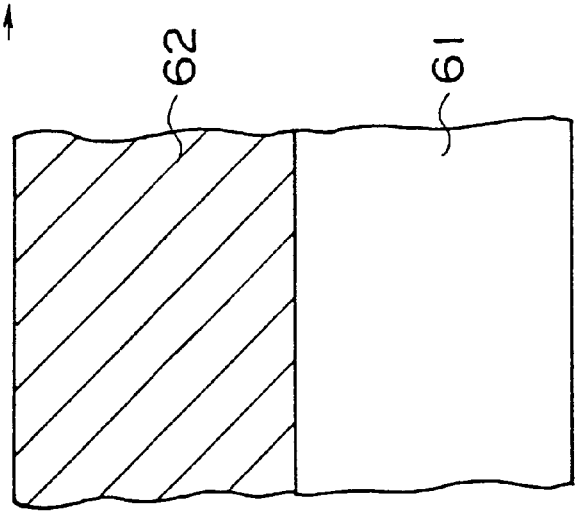

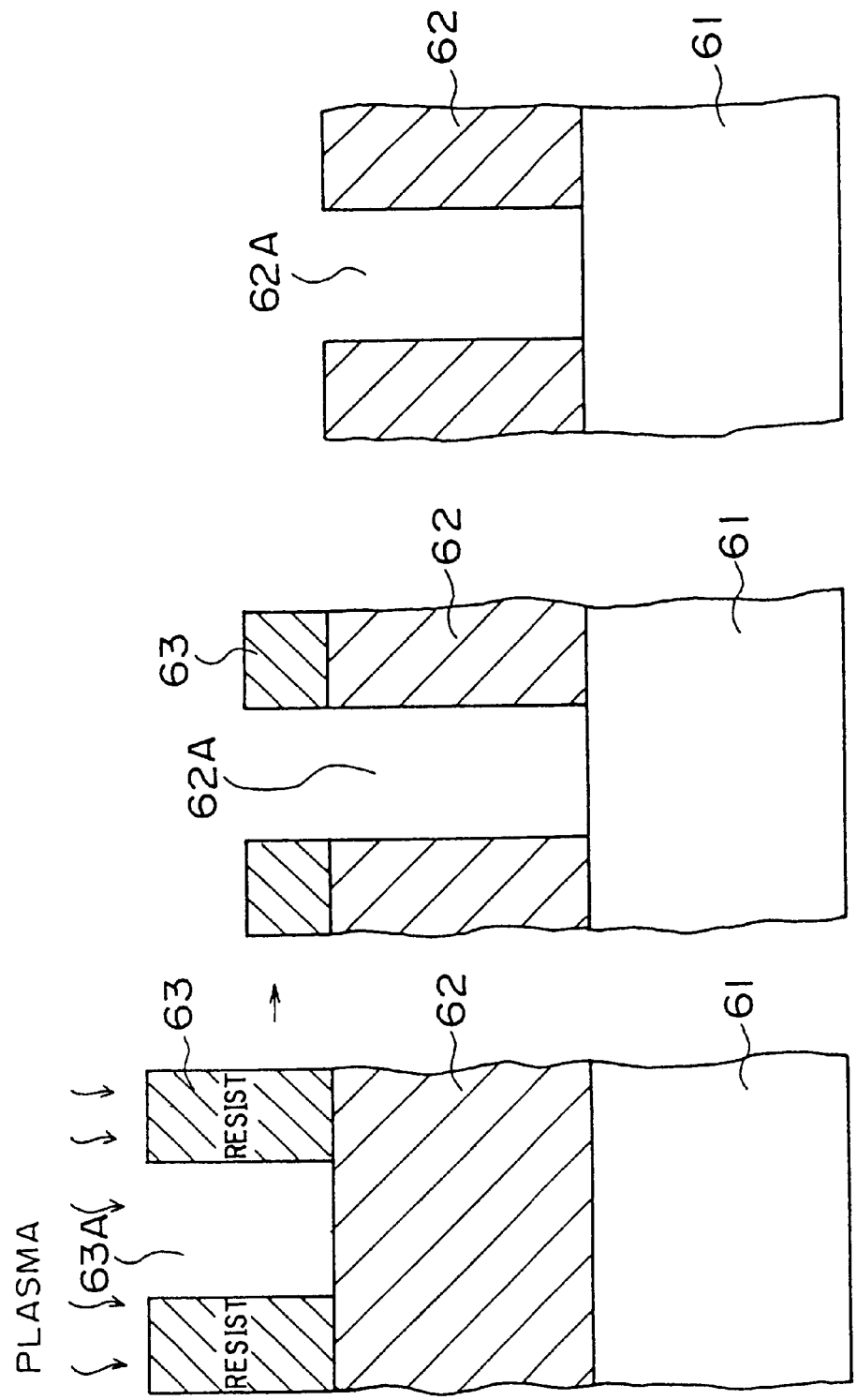

DRY ETCHING PROCESS AND A FABRICATION PROCESS OF A SEMICONDUCTOR DEVICE USING SUCH A DRY ETCHING PROCESS

BACKGROUND OF THE INVENTION

The present invention generally relates to fabrication of semiconductor devices and more particularly to the art of dry etching and a fabrication process of a semiconductor device using a dry etching process.

With the advancement in the fabrication technology of miniaturized semiconductor devices and integrated circuits, efforts are being made not only to miniaturize gate electrode patterns but also various interconnection patterns used in such semiconductor devices. The Al wiring pattern used in the uppermost layer of a multilayer interconnection structure is no exception.

When forming such extremely fine wiring patterns by means of photolithography, it is generally practiced to provide an anti-reflection film of SiN or SiON between a conductor film to be patterned and a resist film during an exposure process of the resist film, for eliminating formation of optical standing waves in the resist film. After the developing process of the resist film thus exposed, the wiring pattern is formed by applying a dry etching process to the conductor film while using a resist pattern thus formed from the resist film as an etching mask.

In the process of forming extremely fine wiring patterns used in recent, so-called submicron devices, on the other hand, it is practiced to reduce the thickness of the resist film and conduct the dry etching process under a reduced pressure environment while using a high-density plasma.

On the other hand, such a dry etching process, conducted in a high-density plasma under a reduced pressure environment, raises a problem in that there tends to develop a facet or shoulder in the resist pattern used for the etching mask as represented in FIGS. 1A and 1B. It is believed that such a facet is formed by the sputtering effect of the plasma acting on the edge part of the resist pattern.

Referring to FIG. 1A, an $SiO_2$ film 12 is formed on a Si substrate 11, and a layer 13 of Al is formed on the $SiO_2$ film 12 as an interconnection layer. Further, the Al layer 13 is covered by an anti-reflection film 14 of SiON, and a resist film 15 is deposited on the anti-reflection film 14. The resist film 15 is then patterned according to the shape of the wiring pattern to be formed in the Al layer 13 as a result of an exposure and developing process. The resist film 15 thereby forms a resist pattern designated also by a reference numeral 15.

Next, in the step of FIG. 1B, the structure of FIG. 1A is introduced into a dry etching apparatus, and the anti-reflection film 14 and the underlying Al layer 13 are patterned consecutively to form the desired wiring pattern while using the resist pattern 15 as an etching mask.

In the foregoing photolithographic patterning process of the Al layer 13, it can be seen that the resist pattern 15 is formed with facets 15a and 15b as a result of the sputtering effect associated with the foregoing dry etching process.

More specifically, the plasma used in the dry etching process acts upon the edge part of the resist pattern 15 of FIG. 1A and the facets 15a and 15b are formed as a result of erosion of the resist pattern 15 by the plasma. When such facets 15a and 15b are formed in the resist pattern 15, the resist pattern 15 is thinned out at the edge part thereof, and the width of the conductor pattern formed as a result of the dry etching process is reduced inevitably. As the resist pattern 15 is used twice, first for the patterning the anti-reflection film 14 and second for patterning of the Al layer 13, the problem of formation of the facets 15a and 15b can provide a profound effect on the patterning of the Al layer 13, particularly the width of the obtained conductor pattern.

In order to suppress the formation of the resist facets, it has been proposed to apply a curing process to the resist pattern 15 prior to the dry etching process. For example, the Japanese Laid-Open Patent Publication 4-304730 describes such a pre-curing process applied to a UV resist pattern having a photosensitivity in a ultraviolet or near-ultraviolet wavelength band such as the g-line wavelength (436 nm) or the i-line wavelength (365 nm) of Hg, wherein the pre-curing process is applied to the UV resist prior to a dry etching process that uses the UV resist as an etching mask.

FIGS. 2A–2C show an example of the photolithographic process that includes a pre-curing process of a conventional UV resist pattern, wherein those parts corresponding to the parts described previously are designated by the same reference numerals and the description thereof will be omitted.

Referring to FIG. 2A showing a process corresponding to the step of FIG. 1A, the resist pattern 15 is formed as a result of the UV-exposure and developing process of the UV resist film, and the structure of FIG. 2A is incorporated into an etching chamber of a dry etching apparatus in the step of FIG. 2B. In the dry etching apparatus, a deep ultraviolet (DUV) radiation having a wavelength of about 300 nm is generated by inducing a plasma in the mixed gas of $CF_4$ and $O_2$ that is introduced into the etching chamber.

The UV resist forming the resist film has a structure represented by the formula (1) as

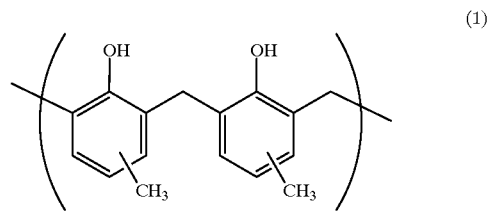

(1)

and there occurs an excitation of π electrons in the benzene ring as a result of the exposure to the foregoing DUV radiation. Thereby, the $CH_3$ group in the resist is eliminated and the $CH_3$ group thus eliminated causes a bridging reaction to form a structure represented by the formula (2) as

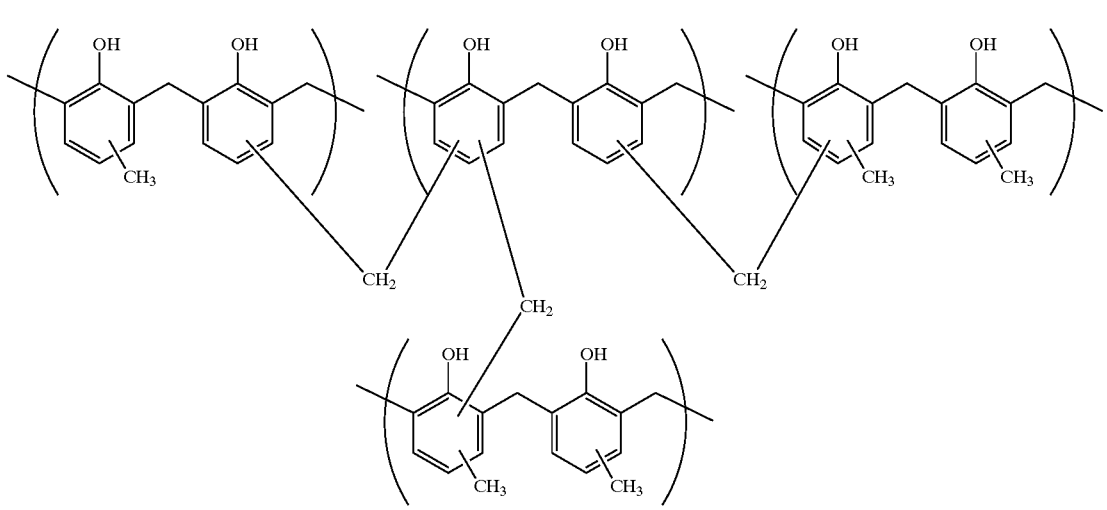
(2)

wherein the resist film thus caused the bridging reaction and having the structure of formula (2) shows an excellent resistance against the dry etching process.

On the other hand, the foregoing process of pre-curing a UV resist pattern by way of a DUV radiation is not applicable to the recent exposure process used for the fabrication of ultrafine, submicron or sub-quarter micron semiconductor devices. It should be noted that such recent, advanced exposure processes generally use an ArF excimer layer or a KrF excimer laser for the source of DUV exposure radiation, while the UV resists do not have a satisfactory photosensitivity to the exposure wavelength of such excimer lasers. The foregoing excimer lasers produce a strong optical radiation in the DUV wavelength band.

In order to achieve an exposure process in such a DUV wavelength, it is generally practiced to use a so-called chemical amplification resist having a composition represented in formula (3) or formula (4) below, wherein the formula (3) represents the structure of the resist exposed by an ArF excimer laser (193 nm), while the formula (4) represents the structure of the resist exposed by a KrF excimer laser (248 nm).

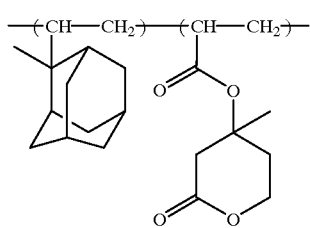
(3)

-continued

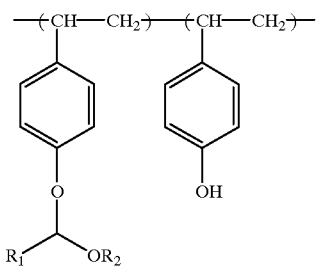
(4)

Contrary to the UV resist of formula (1), it should be noted that the foregoing chemical amplification resist does not contain a group such as $CH_3$ that makes a bonding with the π-electrons of the benzene ring. In other words, the mechanism of curing is different between the foregoing chemical amplification resist and the conventional UV resist. Thus, it is not possible to obtain a desired pre-curing effect even when the pre-curing process of FIG. 2B is applied to the foregoing chemical amplification resist of the formula (3) or formula (4).

In order to avoid the problem of facet formation in the DUV resist, there is a proposal in the Japanese Laid-Open Patent Publication 7-94467 to apply an ion implantation process of $Ar^+$ to the resist pattern 15 in the curing step of FIG. 2B under an acceleration energy of about 10 keV. Further, the foregoing Japanese Laid-Open Patent Publication 7-94467 describes a process of applying a plasma, induced in the mixed gas of $CHF_3$ and $O_2$, to the surface of the resist pattern 15 in the step of FIG. 2B.

FIG. 3 shows the dry etching process corresponding to the step of FIG. 2C conducted while using a chemical amplification resist according to the foregoing teaching of the Japanese Laid-Open Patent Publication in place of the resist pattern 15.

Referring to FIG. 3, the resist pattern 15 is subjected to a pre-curing process in the step corresponding to the step of FIG. 2B by conducting an ion implantation process of $Ar^+$ into the resist pattern 15. In the illustrated example of FIG. 3, the Al layer 13 and the SiON anti-reflection film 14 thereon are patterned under the existence of a high-frequency plasma while using $BCl_3$ and $Cl_2$ as the etching gas.

As represented in FIG. 3, the resist pattern 15 includes, on the top surface and the side walls thereof, a resistant layer 15A as a result of the ion implantation of $Ar^+$, wherein the resistant layer 15A has a resistance against the dry etching process and the problem of facet formation explained with reference to FIG. 1B is successfully eliminated.

On the other hand, the foregoing process has a drawback in that, because of the necessity of conducting an ion implantation process of $Ar^+$ under the large acceleration energy as high as 10 keV, the resist pattern 15 has to be introduced, together with the substrate 11, into an ion implantation apparatus prior to the step of conducting the dry etching process. However, the use of such a separate ion implantation process increases the number of fabrication steps and hence the fabrication cost of the semiconductor device.

According to the alternate teaching of the foregoing Japanese Laid-Open Patent Publication 7-94467, the use of the separate ion implantation process can be avoided by exposing the chemical amplification resist pattern 15 to the plasma of $CHF_3$ and $O_2$ as noted before. In this case, too, a resistant layer similar to the resistant layer 15A is formed on the top surface and on the side walls. Thereby, the problem of facetting is effectively avoided. According to this process, the anti-reflection film 14 is patterned during the plasma processing of the resist pattern 15.

On the other hand, the foregoing process of forming the resistant layer 15A in the resist pattern 15 by the plasma process has a drawback, associated with the depositive nature of $CHF_3$, a fluorocarbon compound, in that a carbon polymer compound tends to cause a deposition on the surface of the resist pattern 15 when such a plasma process is applied. Thus, there arises a problem of etching shift in which the width of the obtained wiring pattern tends to exceed the desired or designed width of the wiring pattern when the resist pattern 15 thus processed is used as an etching mask in the dry etching process of FIG. 2C or FIG. 3. Further, the degree of this etching shift tends to change depending on the density of the wiring patterns thus formed on the substrate.

Thus, the conventional process has a drawback in that it is difficult to form the desired wiring pattern by using a dry etching process of a conductor layer while using a chemical amplification resist pattern having a sensitivity in the DUV wavelength such that the obtained wiring pattern has a designed width irrespective of the pattern density of the wiring patterns.

SUMMARY OF THE INVENTION

Accordingly, it is a general object of the present invention to provide a novel and useful fabrication process of a semiconductor device wherein the foregoing problems are eliminated.

Another and more specific object of the present invention is to provide a fabrication process of a semiconductor device wherein the facetting in a resist pattern having a sensitivity in the DUV wavelength is effectively suppressed and is capable of forming a conductor pattern with a controlled pattern width without dependence on the pattern density.

Another object of the present invention is to provide a method of fabricating a semiconductor device, comprising the steps of:

(a) forming a resist pattern on a conductor layer;

(b) exposing said resist pattern to any of a plasma of a rare gas, a plasma of a mixture of a rare gas and a fluorine-containing gas, and a plasma of $N_2$; and (c) applying, after step (b), a dry etching process to said conductor layer while using said resist pattern as a mask;

wherein said method further includes a step of removing an anti-reflection film, said step of removing said anti-reflection film being conducted concurrently with said step (b).

According to the present invention, a resistant layer having a resistance against a dry etching process is formed on the surface of the resist pattern, by merely exposing the resist pattern to any of the plasma of a rare gas, the plasma of a mixture of a rare gas and a fluorine-containing gas, and the plasma of $N_2$, prior to the dry etching process. Thereby, the resist pattern remains substantially intact after the dry etching process and the facetting of the resist pattern is effectively suppressed. Thereby, the conductor pattern formed as a result of the patterning of the conductor layer has a width controlled to a desired or designed width. By using the plasma of a rare gas, a mixture of a rare gas and a fluorine-containing gas, or of $N_2$, the problem of deposition of carbonaceous polymer on the resist pattern, which tends to occur when a plasma of $CHF_3$ and $O_2$ is used for the same purpose, is effectively avoided. Thereby, the increase of the resist pattern width is also suppressed successfully. The present invention is particularly effective when using a resist pattern having a photosensitivity in the DUV wavelength.

Other objects and further features of the present invention will become apparent from the following detailed description when read in conjunction with the attached drawings.

BRIEF DESCRIPTION OF THE DRAWINGS

FIGS. 7A–7H are diagrams showing the fabrication process of a semiconductor device according to a first embodiment of the present invention;

FIGS. 8A–8G are diagrams showing the fabrication process of a semiconductor device according to a second embodiment of the present invention;

FIGS. 9A–9F are diagrams showing the fabrication process of a semiconductor device according to a third embodiment of the present invention.

DETAILED DESCRIPTION OF THE PREFERRED EMBODIMENTS

Principle

Figure 1A:
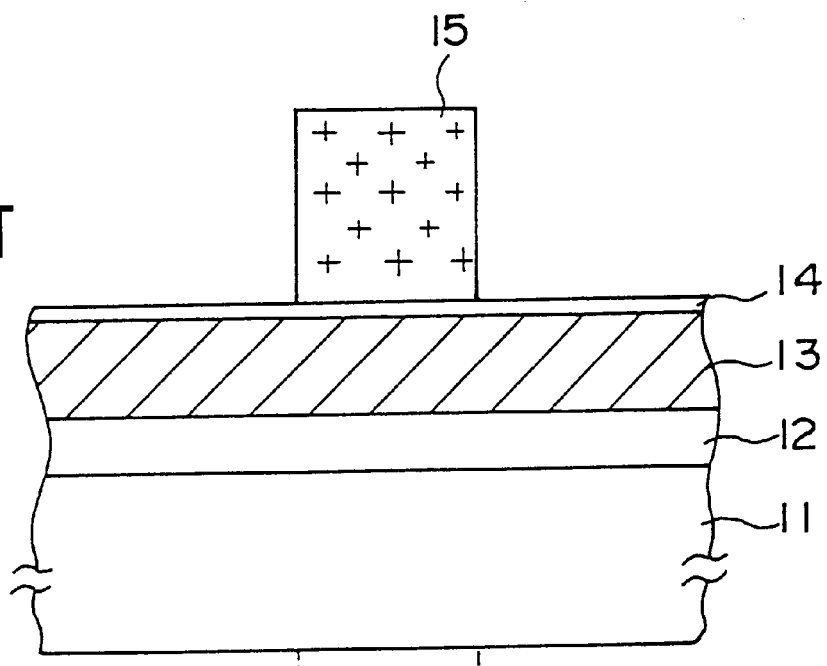
FIGS. 1A and 1B are diagrams showing a conventional dry etching process together with a problem thereof.
Figure 1B:
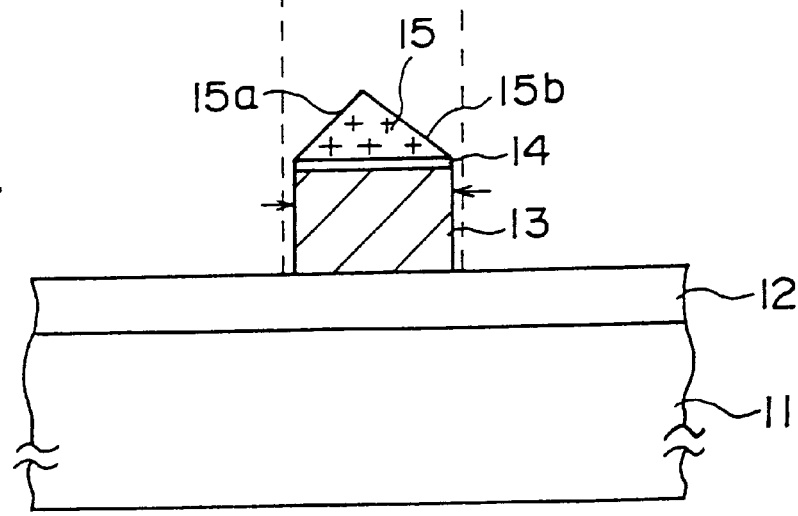
Figure 2A:
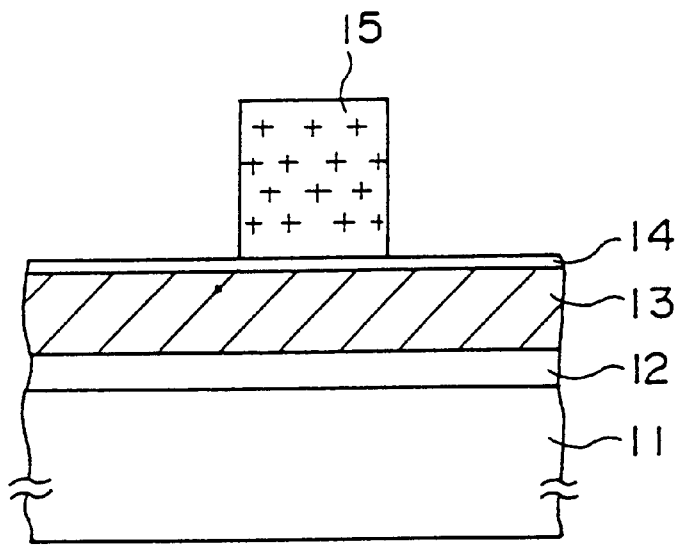
FIGS. 2A–2C are diagrams showing a further conventional dry etching process.
Figure 2B:
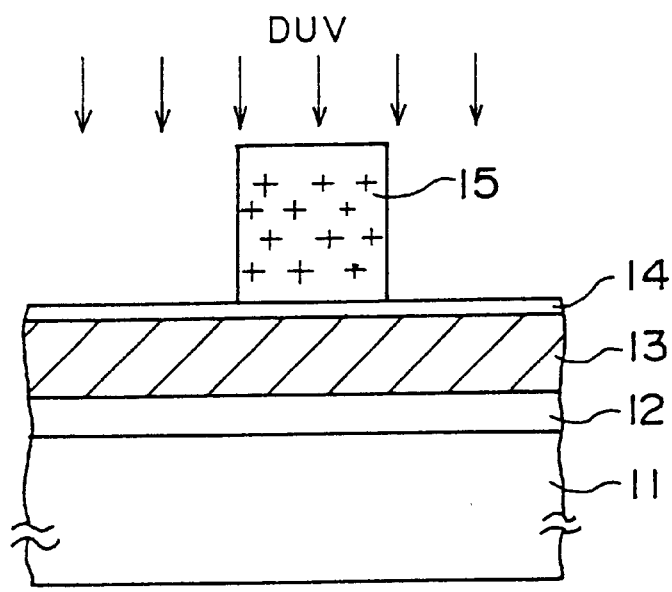
Figure 2C:
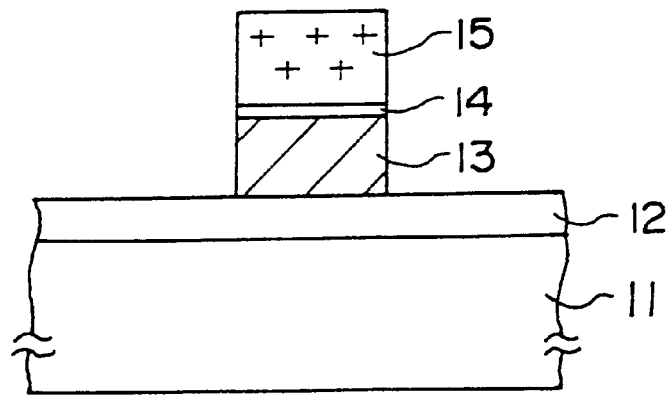
Figure 3:
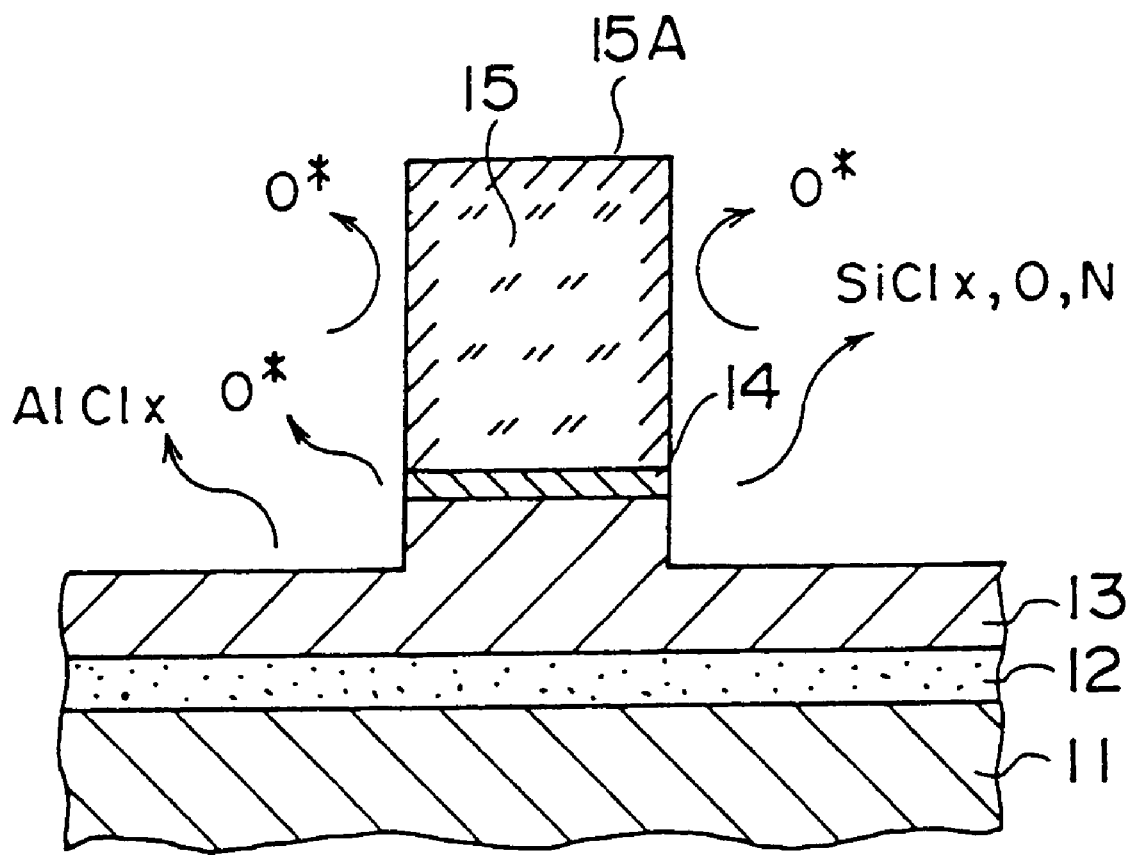
FIG. 3 is a diagram explaining the mechanism of a conventional dry etching process.
Figure 4:
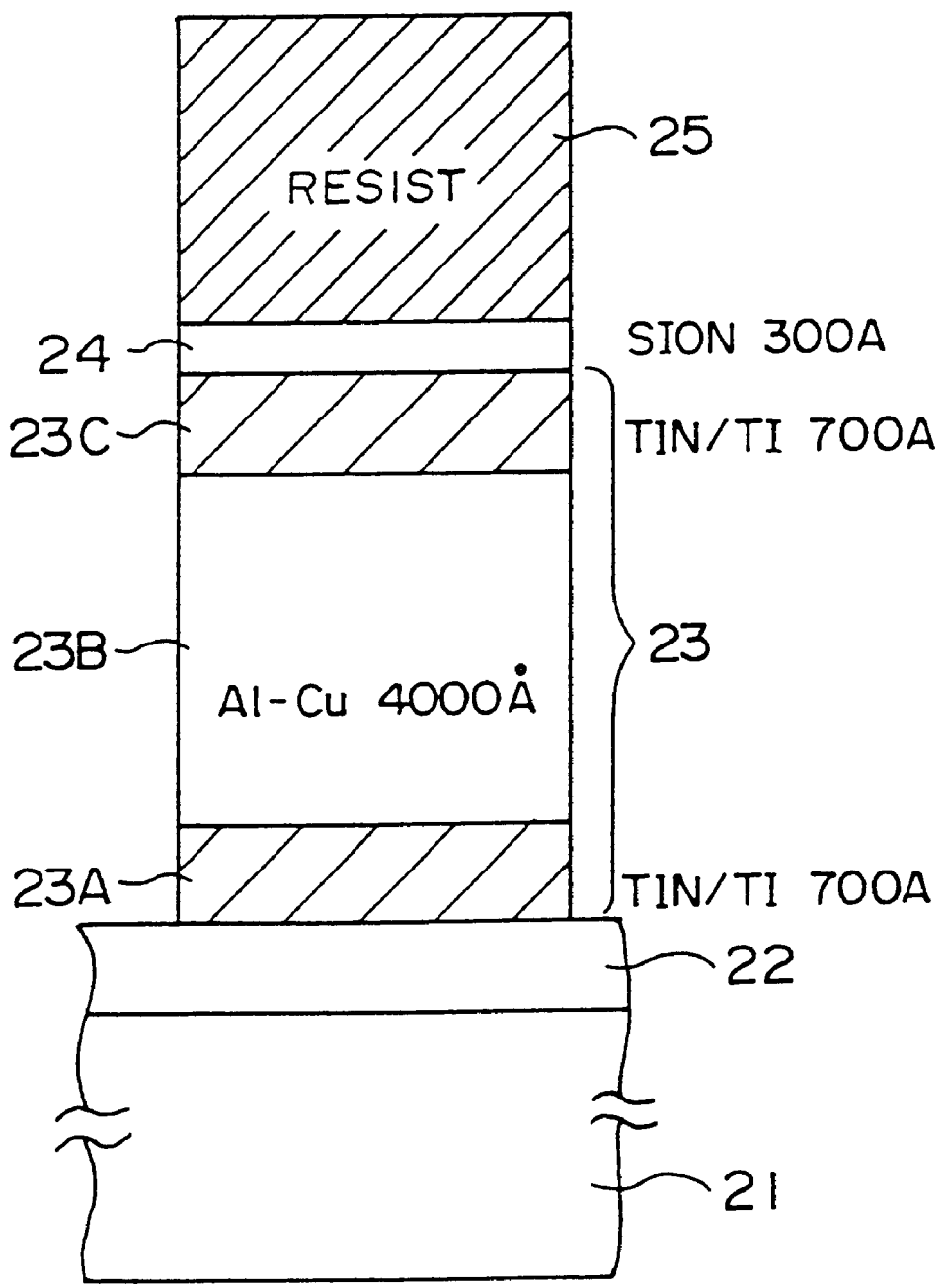
FIG. 4 is a diagram explaining the principle of the present invention.

FIG. 4 shows the principle of the present invention.

Referring to FIG. 4, a Si substrate 21 has a top surface covered by an $SiO_2$ film 22, and a barrier layer 23A having a TiN/Ti stacking structure is formed thereon with a thickness of about 70 nm. The barrier layer 23A is covered by a conductor layer 23B of an Au—Cu alloy with a thickness of about 400 nm, and a top barrier layer 23C of the TiN/Ti stacking structure is formed further on the conductor layer 23B with a thickness of about 70 nm. The layers 23A–23C form together a conductive layer 23, and an anti-reflection film 24 of SiON is formed on the conductor layer 23 with a thickness of about 30 nm. Further, a resist film 25 having a photosensitivity in the DUV wavelength is deposited on the anti-reflection film 24. The resist film 25 may have a composition represented in any of the formula (3) or formula (4) explained before.

The resist film 25 thus formed is subjected to an exposure process in an exposure apparatus that uses a KrF excimer laser or an ArF excimer laser as a radiation source, and there is formed a DUV resist pattern corresponding to the conductor pattern to be formed after a developing process of the resist film 25 thus exposed. The resist pattern thus formed is designated also by the reference numeral 25.

Figure 5:
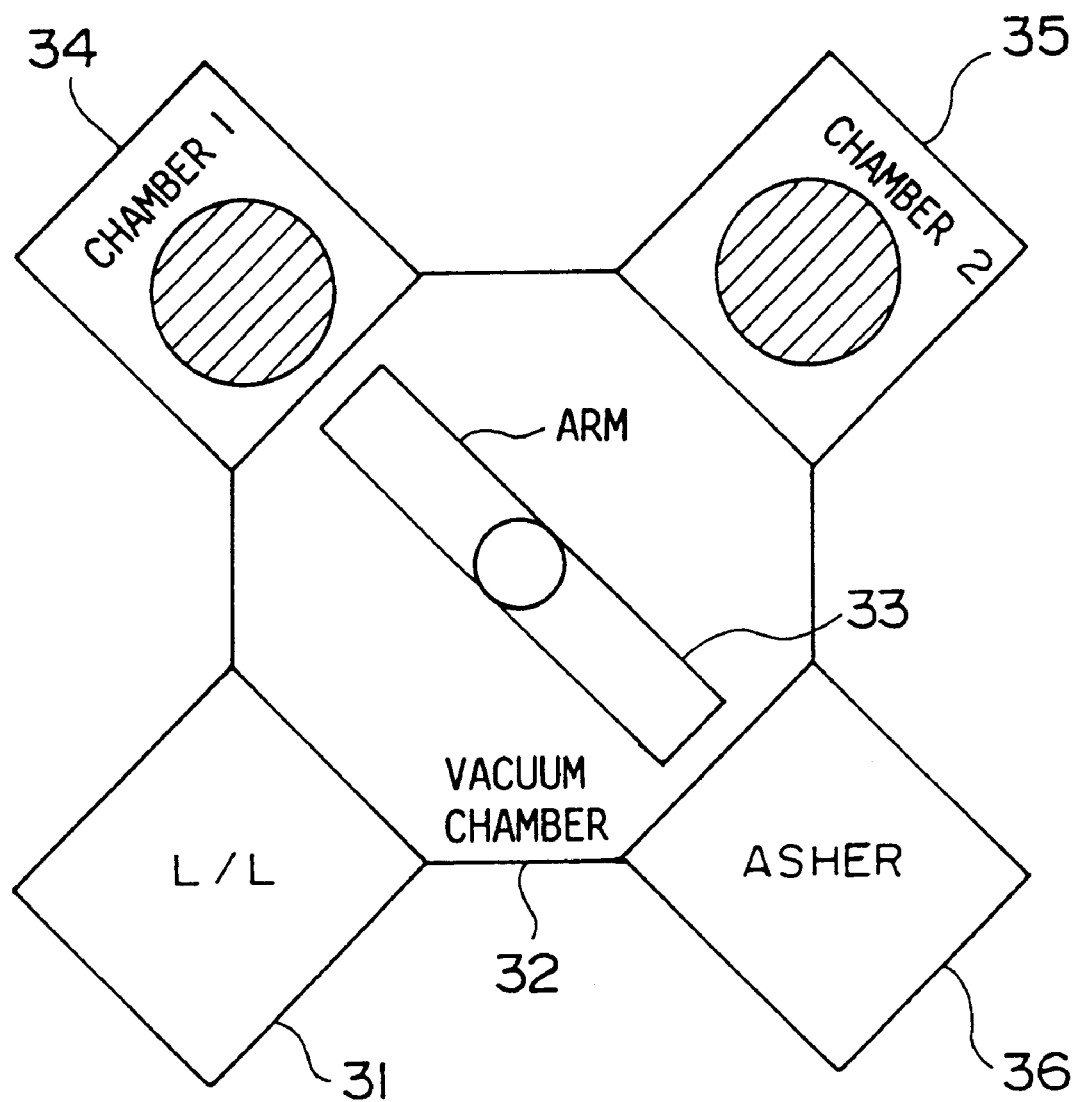
FIG. 5 is a diagram showing the dry etching apparatus used in the present invention.

In the present invention, the structure thus obtained is incorporated, after the step of formation of the resist pattern 25, into a first dry etching chamber 34 of a single wafer processing apparatus 30 represented in FIG. 5 via a load lock mechanism 31 and a vacuum transportation chamber 32. It should be noted that the vacuum transportation chamber 32 includes a transportation arm 33 for transporting the wafer to be processed.

In the first dry etching chamber 34, there is provided a two-frequency parallel-plate reactive ion etching (RIE) apparatus, and the resist pattern 25 is exposed to a plasma in the foregoing first dry etching chamber 34. During the plasma process in the dry etching chamber 34, the anti-reflection film 24 is patterned while using the resist pattern 25 as an etching mask.

After the plasma processing in the dry etching chamber 34, the wafer is forwarded to a second dry etching chamber 35 via the foregoing vacuum transportation chamber 32, wherein the dry etching chamber 35 is supplied with an etching gas mixture of $Cl_2$ and $BCl_3$, and the conductive layer 23 is subjected to a dry etching process in a gas plasma of the foregoing etching gas mixture in the dry etching chamber 35. It should be noted that the structure of FIG. 4 represents the state in which the dry etching is completed in the dry etching chamber 35. It should be noted that the dry etching process of the foregoing anti-reflection film 24 or the dry etching process of the conductive layer 23 is conducted by using an ECR dry etching apparatus provided in the chamber 35 under a reduced pressure of 4 mTorr, while supplying a microwave power of 600 W and an RF power of 45 W. Thereby, $Cl_2$ and $BCl_3$ are supplied respectively with the flow rates of 147 cc/min and 63 cc/min.

FIGS. 6A–6D show the actual structure obtained by the dry etching process conducted in the dry etching chamber 35, wherein FIGS. 6A–6D represent different specimens processed under different plasma conditions in the first dry etching chamber 34.

Figure 6A:
FIGS. 6A–6D are further diagrams explaining the principle of the present invention.

More specifically, FIG. 6A shows the case in which the plasma processing of the resist pattern 25 in the dry etching chamber 34 is eliminated. In other words, FIG. 6A represents a reference specimen for comparison. In the structure of FIG. 6A, it should be noted that the anti-reflection film 24 of SiON is also omitted.

Referring to FIG. 6A, the bright part of the illustration represents a groove constituting a line and space pattern having a pattern width of 0.3 $\mu$m, and it can be seen that there is formed a conductor pattern corresponding to the conductive pattern 23 between a groove and an adjacent groove. Further, there is formed a dark resist pattern corresponding to the resist pattern 25 on the conductor pattern. As a result of the dry etching process in the dry etching chamber 35, the resist pattern 25 shows a conspicuous facetting.

Figure 6B:
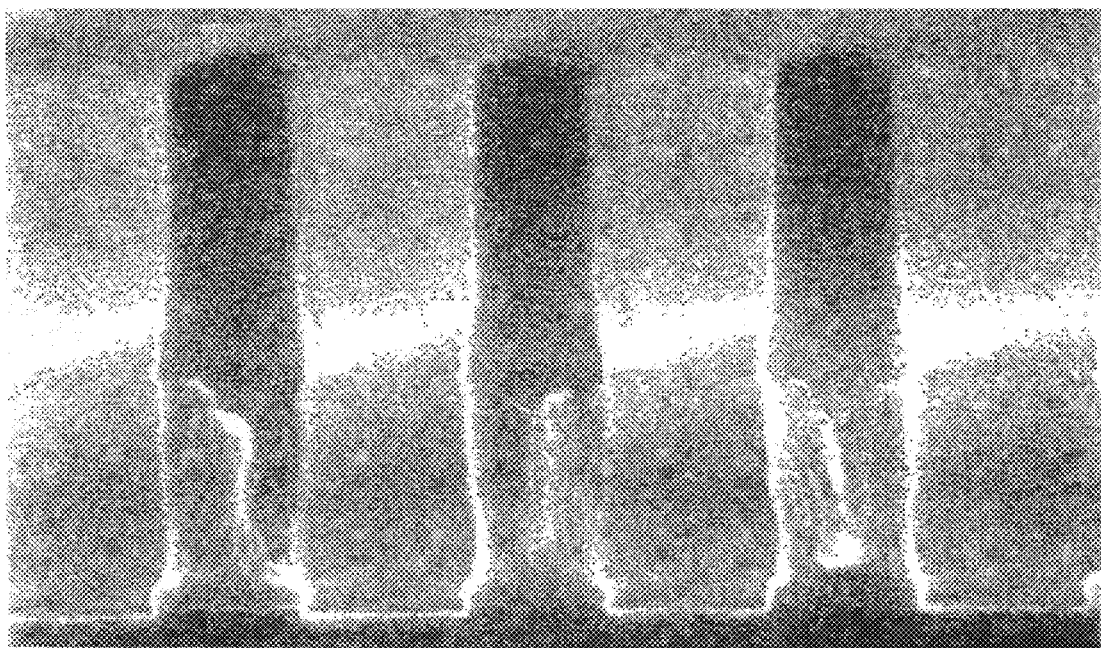

FIG. 6B, on the other hand, represents the case in which the resist pattern 25 is exposed, in the dry etching chamber 34, to a mixed gas plasma of $CF_4$ and Ar. More specifically, the result of FIG. 6B is for the case in which the plasma processing is conducted in the dry etching chamber 34 under a pressure of 25 mTorr while supplying an electric power of 2500 W to the upper electrode of the parallel-plate RIE apparatus and an electric power of 1400 W to the lower electrode. During the plasma process, $CF_4$ and Ar were supplied with respective flow rates of 100 cc/min and 300 cc/min. The dry etching process in the second dry etching chamber 35 was conducted similarly as noted before.

Referring to FIG. 6B, it can be seen that the resist pattern 25 on the conductive pattern 23 has a flat top surface, indicating no substantial formation of facetting. Thus, the conductive pattern 23 thus patterned by using the resist pattern 25 has the desired or designed pattern width. The result of FIG. 6B clearly indicates that an effective resistant layer is formed on the surface of the resist pattern 25.

Figure 6C:
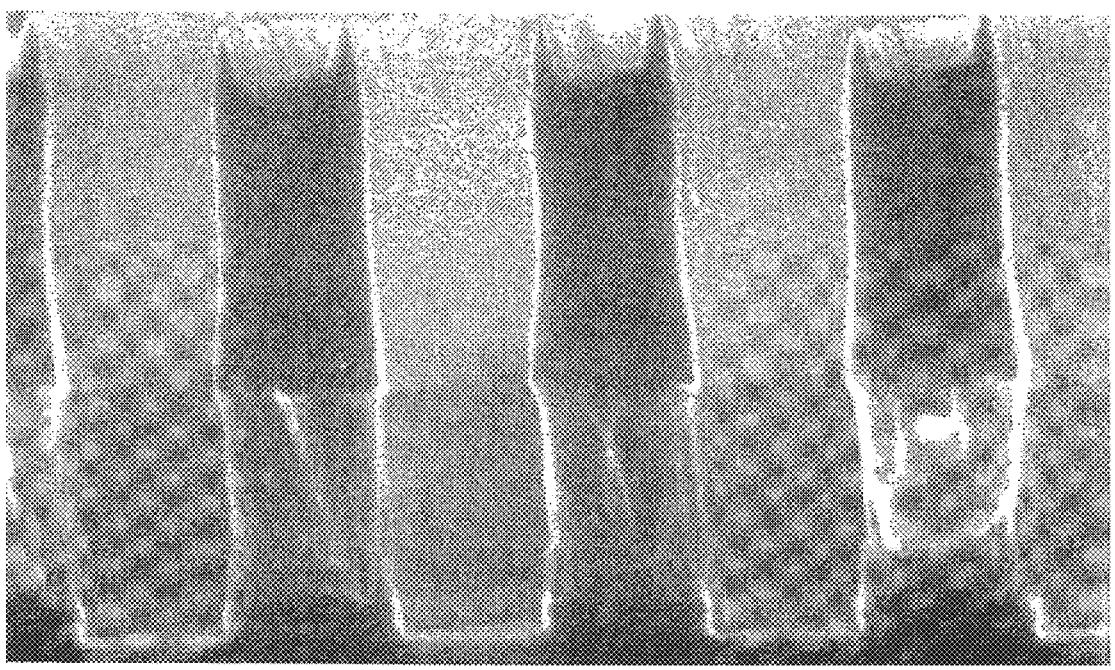

FIG. 6C shows the result in which the SiON anti-reflection coating 24 is eliminated, wherein the result of FIG. 6C corresponds to the case in which the resist pattern 25 is exposed in the dry etching chamber 34 to a gas plasma of Ar. It should be noted that the plasma processing in the dry etching chamber 34 was conducted under a pressure of 50 mTorr while supplying an electric power of 2500 W to the upper electrode and an electric power of 1400 W to the lower electrode. During the plasma processing process, Ar was supplied to the dry etching chamber 34 with the flow rate of 300 cc/min. The dry etching process of the conductive layer 23 in the dry etching chamber 35 was conducted similarly as before.

Referring to FIG. 6C, the resist pattern 25 remaining on the conductor pattern 23 shows a lateral extension part indicative of the existence of the hardened, resistant layer, and there is no sign of facet formation in the resist pattern 25. As a result of the formation of the resistant layer, the resist pattern 25 is substantially free from erosion, and the conductor pattern 23 thus patterned under the existence of the resist pattern 25 shows a width coincident to the desired or designed pattern width.

Figure 6D:
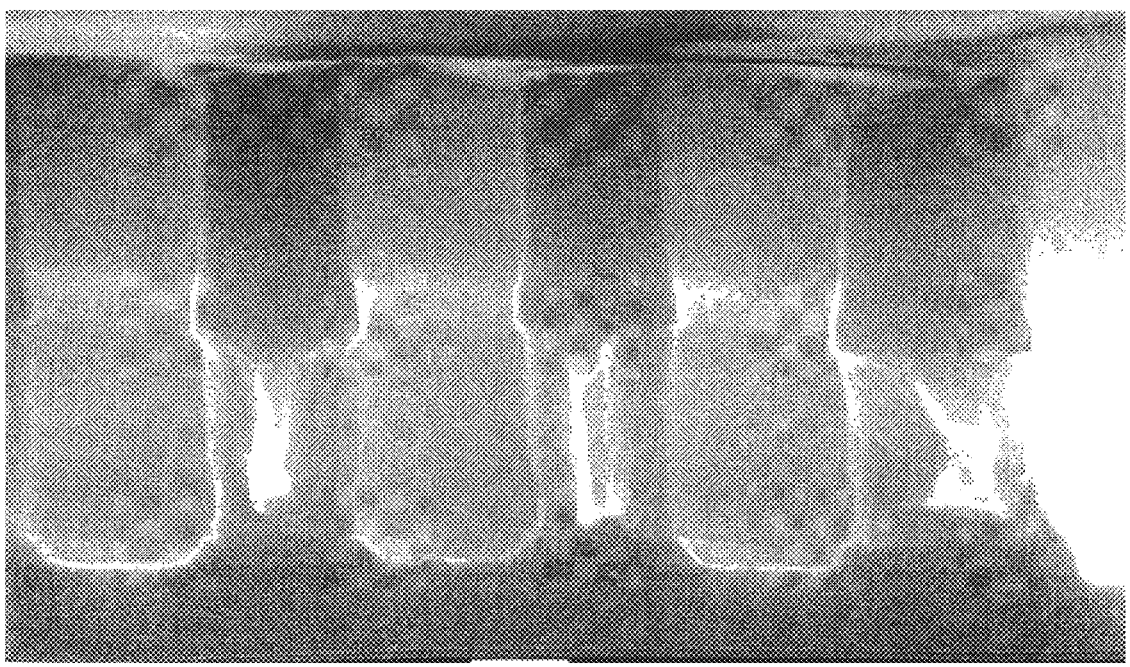

FIG. 6D shows the result in which the SiON anti-reflection coating 24 is eliminated and the resist pattern 25 is exposed in the dry etching chamber 34 to a gas plasma of $N_2$. It should be noted that the plasma processing in the dry etching chamber 34 was conducted under a pressure of 750 mTorr while supplying an electric power of 1000 W. During the plasma processing process, $N_2$ was supplied to the dry etching chamber 34 with the flow rate of 600 cc/min. The dry etching process of the conductive layer 23 in the dry etching chamber 35 was conducted similarly as before.

Referring to FIG. 6D, it can be seen that the resist pattern 25 remaining on the conductor pattern 23 has a flat top surface, and there is no sign of facet formation after the dry etching process of the conductive layer 23. Thus, the conductor pattern 23 thus formed has a desired or designed pattern width.

FIGS. 10A–10D respectively represent the structure of FIGS. 6A–6D schematically with reference numerals.

Figure 10A:
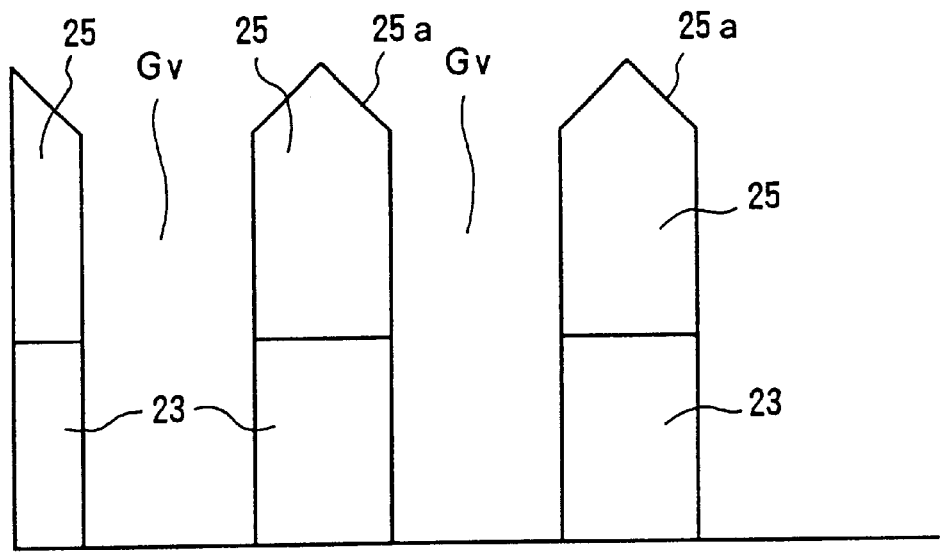
FIGS. 10A–10D are diagrams corresponding to FIGS. 6A–6D for explanation of the principle of the present invention.

More specifically, FIG. 10A shows the case in which the plasma processing of the resist pattern 25 in the dry etching chamber 34 is eliminated. In order words, FIG. 10A represents a reference specimen for comparison. In the structure of FIG. 10A, it should be noted that the anti-reflection film 24 of SiON is also omitted.

Referring to FIG. 10A, the bright part of the illustration represents a groove Gv constituting a line and space pattern having a pattern width of 0.3 μm, and it can be seen that there is formed a conductor pattern corresponding to the conductive pattern 23 between a groove and an adjacent groove. Further, there is formed a dark resist pattern corresponding to the resist pattern 25 on the conductor pattern 23. As a result of the dry etching process in the dry etching chamber 35, the resist pattern 25 shows a conspicuous facetting on a top surface 25a thereof.

Figure 10B:
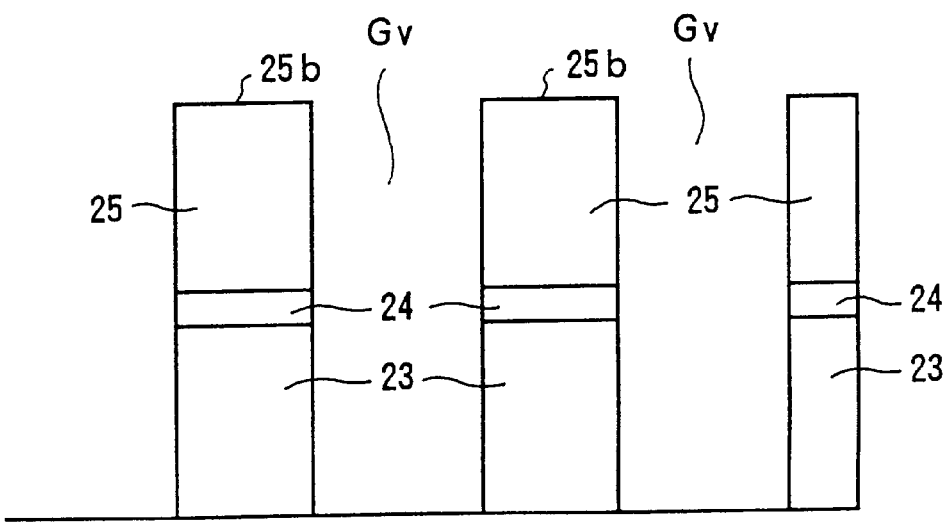

FIG. 10B corresponding to FIG. 6B represents the case in which the resist pattern 25 is exposed, in the dry etching chamber 34, to a mixed gas plasma of $CF_4$ and Ar. More specifically, the result of FIG. 10B is for the case in which the plasma processing is conducted in the dry etching chamber 34 under a pressure of 25 mTorr while supplying an electric power of 2500 W to the upper electrode of the parallel-plate RIE apparatus and an electric power of 1400 W to the lower electrode. During the plasma process, $CF_4$ and Ar were supplied with respective flow rates of 100 cc/min and 300 cc/min. The dry etching process in the second dry etching chamber 35 was conducted similarly as noted before.

Referring to FIG. 10B, it can be seen that the resist pattern 25 on the conductive pattern 23 has a flat top surface 25b, indicating no substantial formation of facetting. Thus, the conductive pattern 23 thus patterned by using the resist pattern 25 has the desired or designed pattern width. The result of FIG. 10B clearly indicates that an effective resistant layer is formed on the surface of the resist pattern 25.

Figure 10C:
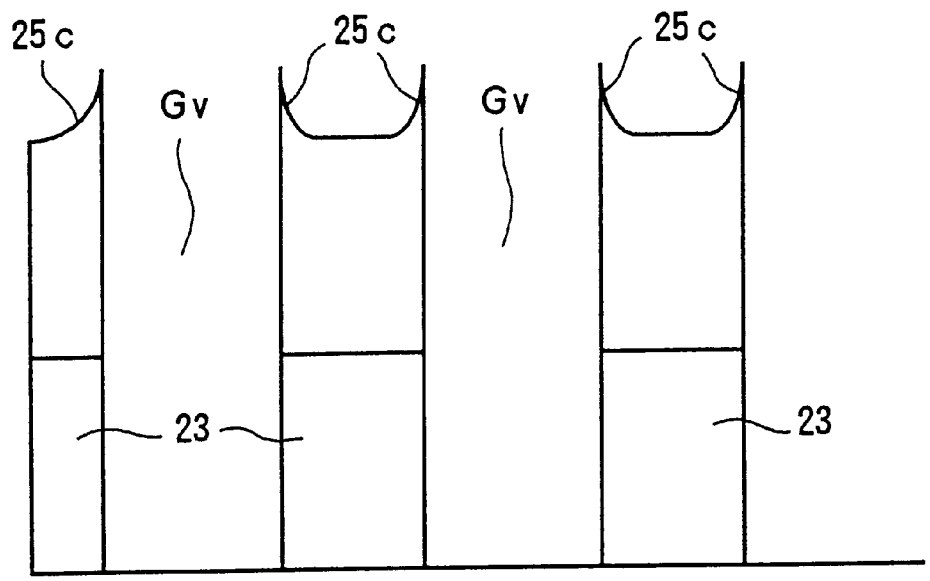

FIG. 10C corresponding to FIG. 6C shows the result in which the SiON anti-reflection coating 24 is eliminated, wherein the result of FIG. 10C corresponds to the case in which the resist pattern 25 is exposed in the dry etching chamber 34 to a gas plasma of Ar. It should be noted that the plasma processing in the dry etching chamber 34 was conducted under a pressure of 50 mTorr while supplying an electric power of 2500 W to the upper electrode and an electric power of 1400 W to the lower electrode. During the plasma processing process, Ar was supplied to the dry etching chamber 34 with the flow rate of 300 cc/min. The dry etching process of the conductive layer 23 in the dry etching chamber 35 was conducted similarly as before.

Referring to FIG. 10C, the resist pattern 25 remaining on the conductor pattern 23 shows a lateral extension part 25c indicative of the existence of the hardened, resistant layer, and there is no sign of facet formation in the resist pattern 25. As a result of the formation of the resistant layer, the resist pattern 25 is substantially free from erosion, and the conductor pattern 23 thus patterned under the existence of the resist pattern 25 shows a width coincident to the desired or designed pattern width.

Figure 10D:
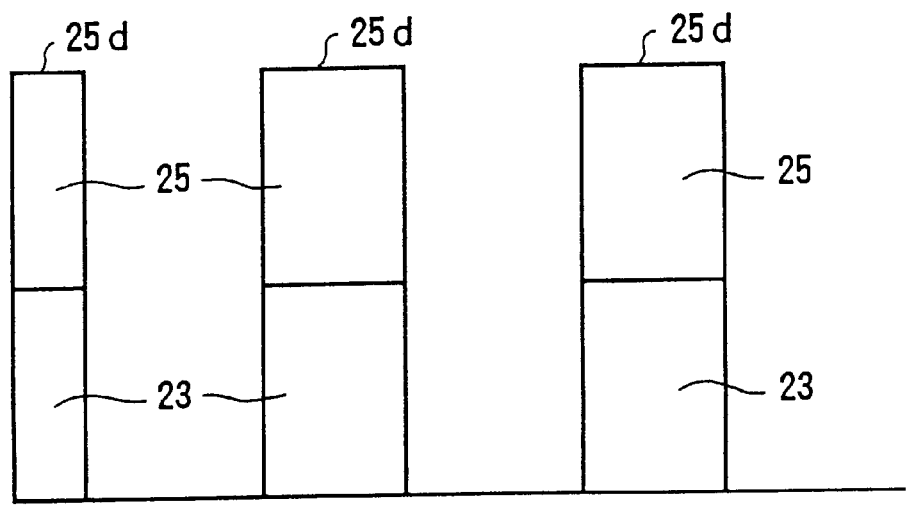

FIG. 10D corresponding to FIG. 6D shows the result in which the SiON anti-reflection coating 24 is eliminated and the resist pattern 25 is exposed in the dry etching chamber 34 to a gas plasma of $N_2$. It should be noted that the plasma processing in the dry etching chamber 34 was conducted under a pressure of 750 mTorr while supplying an electric power of 1000 W. During the plasma processing process, $N_2$ was supplied to the dry etching chamber 34 with the flow rate of 600 cc/min. The dry etching process of the conductive layer 23 in the dry etching chamber 35 was conducted similarly as before.

Referring to FIG. 10D, it can be seen that the resist pattern 25 remaining on the conductor pattern 23 has a flat top surface 25d, and there is no sign of facet formation after the dry etching process of the conductive layer 23. Thus, the conductor pattern 23 thus formed has a desired or designed pattern width.

Further, a comparative investigation was made with regard to the structure of FIG. 4 by forming a line-and-space pattern and an isolated pattern having a width of 0.24 μm by applying the process described in the foregoing Japanese Laid-Open Patent Publication 7-94467 and by forming a similar line-and-space pattern and an isolated pattern by applying the process of the present invention. In the case of applying the process of the foregoing Japanese Laid-Open Patent Publication 7-94467, the plasma exposure process conducted in the first dry etching chamber 34 of FIG. 5 is conducted in a mixed gas plasma of $CHF_3$ and $O_2$. More specifically, the plasma exposure process is conducted in the dry etching chamber 34 under a pressure of 25 mTorr while supplying an electric power of 2500 W to the upper electrode and an electric power of 1400 W to the lower electrode. During the plasma exposure process, $CHF_3$ $_{and\ O2}$ are supplied to the dry etching chamber 34 with respective flow rates of 80 cc/min and 20 cc/min.

According to the foregoing comparative investigation, it was discovered that the line-and-space pattern thus formed has a designed pattern width in any of the foregoing conventional process and the process of the present invention. On the other hand, in the case of the isolated pattern, it was discovered that the pattern size increases over the desired or designed pattern size when the isolated pattern is formed according to the conventional process. The magnitude of increase of the pattern size can reach as much as +0.06–+0.08 μm. The result of this comparative experiment indicates that, because of the depositive nature of the fluorocarbon gas used in the dry etching chamber 34, there occurs a lateral growth in the resist pattern 25, and such a lateral growth of the resist pattern 25 causes the foregoing etching shift for the isolated patterns.

In the case of the present invention, in which the plasma exposure process is conducted in the dry etching chamber 34 by using a non-depositive gas such as Ar, $CF_4$ or $N_2$, there occurs no such a problem of etching shift, and the obtained pattern has a pattern size exactly identical with the desired or designed pattern width.

By applying the plasma exposure process of the present invention to the resist pattern 25, not only the problem of facetting is avoided in the resist pattern 25 but also the problem of deviation of the pattern width.

First Embodiment

FIGS. 7A–7H show the fabrication process of a semiconductor device according to a first embodiment of the present invention.

Referring to FIG. 7A, a substrate 41 carrying thereon a semiconductor device such as a MOSFET (not shown) is covered by an interlayer insulation film 42 of $SiO_2$ or an organic SOG, and a conductive layer 43 is formed on the interlayer insulation film 42 in the step of FIG. 7B by depositing a barrier layer 43a of the TiN/Ti structure, an Al—Cu alloy layer 43b and another barrier layer 43c of the TiN/Ti structure consecutively with respective thicknesses of typically 70 nm, 400 nm and 70 nm.

Next, in the step of FIG. 7C, an anti-reflection film 44 of SiON or SiN is formed on the conductive layer 43 with a thickness of about 30 nm, and a resist film 45 of a DUV resist having a formula (3) or (4) explained before is formed on the anti-reflection film 44 in the step of FIG. 7D. The resist film 45 is then exposed to a DUV wavelength radiation produced by a KrF excimer laser or an ArF excimer laser in the step of FIG. 7D, and a resist pattern designated also by the reference numerals 45 is formed in the step of FIG. 7E as a result of the developing process conducted by an alkaline developing solution.

Next, in the step of FIG. 7E, the substrate 41 carrying the resist pattern 45 thus patterned is introduced into the dry etching chamber 34 of the dry etching apparatus 30 of FIG. 5, and the resist pattern 45 is exposed to a plasma of any of Ar, a mixture of Ar and $CF_4$ or $N_2$. As a result of the plasma exposure process of FIG. 7E, there is formed a resistant layer on the surface of the resist pattern 45.

Next, in the step of FIG. 7F, the structure of FIG. 7E is incorporated into the dry etching chamber 35 of the dry etching apparatus 30 of FIG. 5, and the anti-reflection film 44 is subjected to a patterning process in the mixed gas plasma of $Cl_2$ and $BCl_3$ while using the foregoing resist pattern 45 as an etching mask.

Next, in the step of FIG. 7G, the conductive layer 43 is subjected to a patterning process in the same dry etching chamber 35 by using the mixed gas plasma of $Cl_2$ and $BCl_3$ similarly as before, while using the resist pattern 45 as an etching mask. As a result of the dry etching process, the desired conductor pattern is obtained.

Next, in the step of FIG. 7H, the structure of FIG. 7G is forwarded to an ashing chamber 36 of the dry etching apparatus 30 of FIG. 5, and the resist pattern 45 is removed by an ashing process.

According to the foregoing process of the present invention, a resistant layer is formed on the surface of the resist pattern 45 in the plasma exposure process of FIG. 7E, and the resist pattern 45 is free from facet formation even when the dry etching process is conducted in the step of FIG. 7F or FIG. 7G. As a non-depositive gas such as Ar, a mixture of Ar and $CF_4$, or $N_2$ is used in the plasma exposure process of FIG. 7E, the problem of etching shift caused by the change in the size of the resist pattern, or the change of the pattern width depending on the pattern density, is successfully avoided.

In the foregoing process of the present embodiment, it is also possible to conduct the plasma exposure process of FIG. 7E in the same processing chamber used in the dry etching process of FIG. 7F or 7G.

As the resist pattern 45 used in the present embodiment is formed from a DUV resist film having a photosensitivity in the DUV wavelength, the process of the present embodiment is suitable for a high-resolution exposure process that uses a DUV radiation produced by a KrF excimer laser or an ArF excimer laser.

It should be noted that the anti-reflection film 44 is by no means limited to SiON but other materials such as $SiO_2$, TiN or C may also be used.

Second Embodiment

FIGS. 8A–8C show the fabrication process of a semiconductor device having a polysilicon gate according to a second embodiment of the present invention.

Referring to FIG. 8A, the semiconductor device is constructed on a Si substrate 51, and a gate oxide film 52 is formed on the Si substrate 51 in the step of FIG. 8B by a thermal oxidation process of the Si substrate 51.

Next, in the step of FIG. 8C, a polysilicon film 53 is formed on the gate oxide film 52 typically by a CVD process, and a resist pattern 54 is formed on the polysilicon film 53 by an exposure and developing process of a resist film. In FIG. 8D, illustration of the anti-reflection film is omitted for the sake of simplicity.

Next, in the step of FIG. 8E, the resist pattern 54 is exposed to a plasma of a rare gas such as Ar, or a plasma of a gas mixture of a rare gas and a gas containing F, or a plasma of $N_2$ gas, and a resistant layer is formed on the surface of the resist pattern 54 similarly to the previous embodiment. During the plasma exposure process, the anti-reflection film not illustrated is patterned according to the resist pattern 54.

Next, in the step of FIG. 8F, the polysilicon film 53 and the underlying gate oxide film 52 are patterned by a dry etching process that uses $Cl_2$ and $O_2$ as an etching gas while using the resist pattern 45 as an etching mask, and the gate structure of FIG. 8G is obtained on the Si substrate 51 after ashing the resist pattern 45.

In the present embodiment, a resistant layer is formed in the resist pattern 54 as a result of the plasma exposure process of FIG. 8E, and the problem of facet formation in the resist pattern 54 is effectively eliminated. Thereby, the gate electrode pattern 53 is formed with a controlled pattern width, and the semiconductor device having such a gate electrode pattern 53 is characterized by a controlled gate length. There occurs no problem of etching shift, as the plasma exposure process of FIG. 8E is conducted in a non-depositive gas.

Third Embodiment

FIGS. 9A–9F show the fabrication process of a semiconductor device having a contact hole according to a third embodiment of the present invention.

Referring to FIG. 9A, a Si substrate 61 is covered by an interlayer insulation film 62 of an organic SOG film or a CVD-$SiO_2$ film, and a resist film 63 is formed on the interlayer insulation film 62 in the step of FIG. 9B via an anti-reflection film not illustrated. Further, the resist film 63 is subjected to a DUV exposure and developing process, to form a resist opening 63A in the resist film 63.

Next, in the step of FIG. 9D, the resist film 63 thus patterned is subjected to a plasma exposure process, in which the resist film 63 is exposed to a plasma of a rare gas such as Ar gas, a plasma of a gas mixture of a rare gas and a gas containing F, or a plasma of $N_2$ gas, and there is formed a resistant layer on the surface of the resist pattern 63. Further, the foregoing plasma exposure process achieves a patterning of the anti-reflection film in correspondence to the resist opening 63A.

Further, in the step of FIG. 9E, the interlayer insulation film 62 is subjected to a dry etching process while using the resist pattern 63 as a mask, and there is formed a contact hole 62A in the interlayer insulation film 62 in correspondence to the resist opening 63A.

By removing the resist pattern 63 by an ashing process, the desired contact structure is obtained as represented in FIG. 9F.

In the present embodiment, the resist pattern 63 is substantially free from facetting due to the plasma exposure process in the step of FIG. 9D, and the contact hole 62A is formed with an exactly controlled diameter. By using non-depositive plasma gas in the step of FIG. 9D, the problem of etching shift inducted by the change of size of the resist opening 63A is successfully avoided.

Further, the present invention is not limited to the embodiments described heretofore, but various variations and modifications may be made without departing from the scope of the invention.

What is claimed is:

1. A method of fabricating a semiconductor device, comprising the steps of:

(a) forming a resist pattern on a conductor layer;

(b) exposing said resist pattern to any of a plasma of a rare gas, a plasma of a mixture of a rare gas and a fluorine-containing gas, and a plasma of $N_2$; and (c) applying, after step (b), a dry etching process to said conductor layer while using said resist pattern as a mask;

wherein said method further includes a step of removing an anti-reflection film, said step of removing said anti-reflection film being conducted concurrently with said step (b).

2. A method as claimed in claim 1, wherein said step of forming said resist pattern includes a step of exposing said resist film by a deep ultraviolet radiation.

3. A method as claimed in claim 1, wherein said resist film includes a KrF resist or an ArF resist having a photosensitivity in a deep ultraviolet wavelength.

4. A method as claimed in claim 1, wherein said conductor layer carries thereon an anti-reflection film selected from a group consisting of SiON, $SiO_2$, TiN and C.

5. A method as claimed in claim 1, wherein said step (b) is conducted in a first chamber, and said step (c) is conducted in a second chamber connected to said first chamber by a vacuum transportation path.

6. A method as claimed in claim 1, wherein said step (b) and said step (c) are conducted consecutively in a common chamber.

* * * * *